(12) United States Patent
Warren (10) Patent No.: US 8,157,438 B2
(45) Date of Patent: Apr. 17, 2012

(54) METHOD AND APPARATUS FOR GENERATING ELECTRICITY USING AMBIENT HEAT

(76) Inventor: John Lee Warren, Salmon Arm (CA)

( * ) Notice: Subject to any disclaimer, the term of this patent is extended or adjusted under 35 U.S.C. 154(b) by 65 days.

(21) Appl. No.: 12/805,616

(22) Filed: Aug. 10, 2010

(65) Prior Publication Data
US 2011/0032969 A1    Feb. 10, 2011

Related U.S. Application Data

(60) Provisional application No. 61/273,790, filed on Aug. 10, 2009.

(51) Int. Cl.
*G01J 5/00*    (2006.01)
(52) U.S. Cl. .............. 374/121; 374/2; 374/120
(58) Field of Classification Search .......... 374/121, 374/179, 120, 2; 136/200; 250/388.1
See application file for complete search history.

(56) References Cited

U.S. PATENT DOCUMENTS

| | | | | |
|---|---|---|---|---|
| 3,313,140 A | * | 4/1967 | Trementozzi | 374/2 |
| 3,601,611 A | * | 8/1971 | Kendall | 250/352 |
| 4,634,294 A | * | 1/1987 | Christol et al. | 374/170 |
| 4,885,463 A | * | 12/1989 | Wellman et al. | 250/252.1 |
| 6,751,497 B2 | * | 6/2004 | Fraden | 600/474 |
| 7,286,868 B2 | * | 10/2007 | Govari | 600/424 |
| 2002/0123690 A1 | * | 9/2002 | Fraden | 600/473 |
| 2004/0233968 A1 | * | 11/2004 | Tabata et al. | 374/121 |
| 2007/0201534 A1 | * | 8/2007 | Yamada et al. | 374/179 |

* cited by examiner

*Primary Examiner* — Lisa Caputo
*Assistant Examiner* — Jamel Williams
(74) *Attorney, Agent, or Firm* — Antony C. Edwards (57) ABSTRACT

A thermopile, utilizing the Seebeck effect, is placed into a blackbody cavity or other ambient heat source, where the hot junctions are inside the heat source, and the cold junctions are outside the heat source, and thereby produces a voltage.

28 Claims, 10 Drawing Sheets

METHOD AND APPARATUS FOR GENERATING ELECTRICITY USING AMBIENT HEAT

CROSS REFERENCE TO RELATED APPLICATION

This application claims priority from U.S. Provisional Patent Application No. 61/273,790 filed Aug. 10, 2009 entitled A Method and Apparatus for Generating Electricity Using Ambient Heat.

FIELD OF THE INVENTION

The present invention is a generator that produces electricity using infrared light instead of visible light such as used by voltaic cells.

BACKGROUND OF THE INVENTION

The demand for electricity is continuously increasing. The main source of energy that provides electricity is fossil fuels. Economies like China have had an increased requirement for fossil fuels. As a result OPEC is reluctant to stop increasing oil prices. The United States Department of Energy predicts that coal will continue to dominate as the source of electrical energy well beyond 2030. Individuals, government, and industry are looking for small scale renewable energy technologies.

It costs on average between $8.00 USD and $10.00 USD to install one watt of solar cells. Wind power and other technologies have a comparable price tag. This is well out of reach for the average budget. It is still cheaper to use fossil fuels to produce electricity.

The following describes the theoretical basis for the present invention:

All objects emit blackbody radiation. The energy flux of an ideal blackbody radiator is defined by the Stephan-Boltzman law and is equal to, $$f = sT^4$$

Where "f" is the energy flux, "σ" is the Stephan-Boltzmann constant and T is the absolute temperature in Kelvin. The radiated power is equal to, $$P = AsT^4$$

"P" is the power in Watts per meter, and "A" is the surface area of the radiating surface. Radiation that strikes an object may pass right through, be absorbed, or reflected. No object completely absorbs radiation. Therefore no object is a perfect black body radiator. The emissivity "e" is the ratio of energy radiated by a particular material to energy radiated by a black body at the same temperature. Emissivity is defined as follows.

$$e = \text{actual radiation/blackbody radiation}$$

The power radiated from a non-blackbody radiator is then, $$P = eAsT^4$$

Consider a long rod free floating in a uniform field of blackbody radiation. Assume that most of the rod is black except for the tip being white. Both ends of the rod are exposed to the same radiation flux f and must radiate this flux away to maintain a constant temperature. So $$f = \epsilon_{white} sT^4_{white}$$

And $$f = \epsilon_{black} sT^4_{black}$$

The temperature white and the temperature black are then related this way.

$$e_{white} sT^4_{white} = f = \epsilon_{black} sT^4_{black}$$

This relationship then simplifies to $$e_{white} T^4_{white} = e_{black} T^4_{black}$$

The temperature of the white portion is then $$T_{white} = (e_{black}/e_{white})^{1/4} T_{black}$$

This equation shows that if "$e_{black}$" is not the same value as $e_{white}$, then the temperature of the black portion is not the same as the temperature of the white portion.

It is interesting to note that the surface with the low emissivity (white) will have a higher temperature than the surface that has the high emissivity (black). The black surface will, however, heat up and cool down faster than the white surface.

As the heat is conducted down the length of the rod, from the hot side to the cooler side, some portion is lost by radiation from the surface. A long rod will have different temperatures at its ends. So, an object in thermal dynamic equilibrium with its surroundings can have two temperatures.

Figure 1:
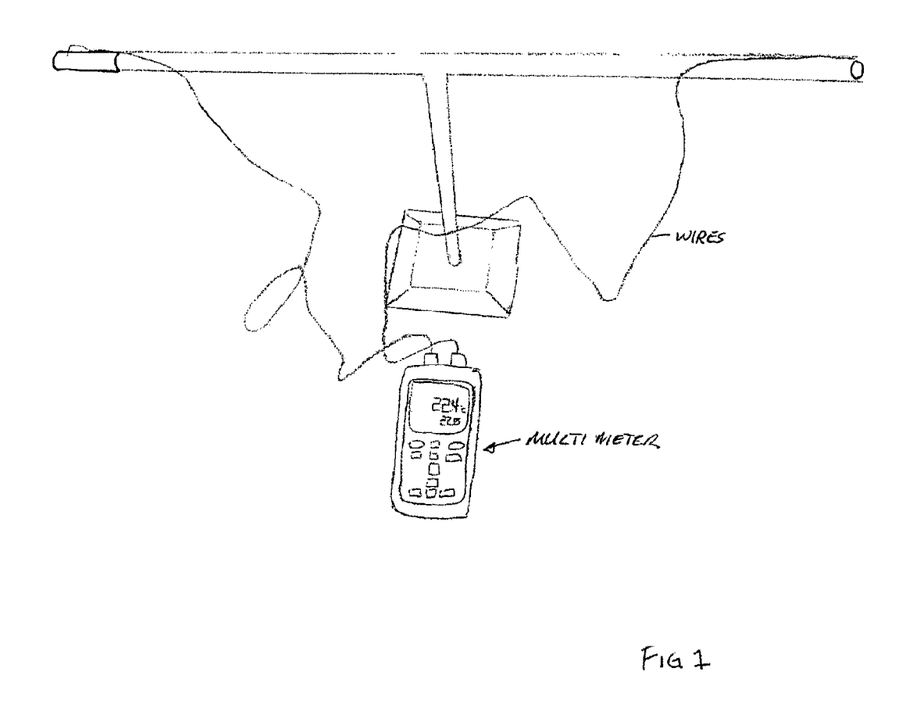
FIG. 1 is, in perspective view, a testing apparatus showing that an object in thermal dynamic equilibrium with its surroundings can have two temperatures as measured by a digital multi-meter.
Figure 2:
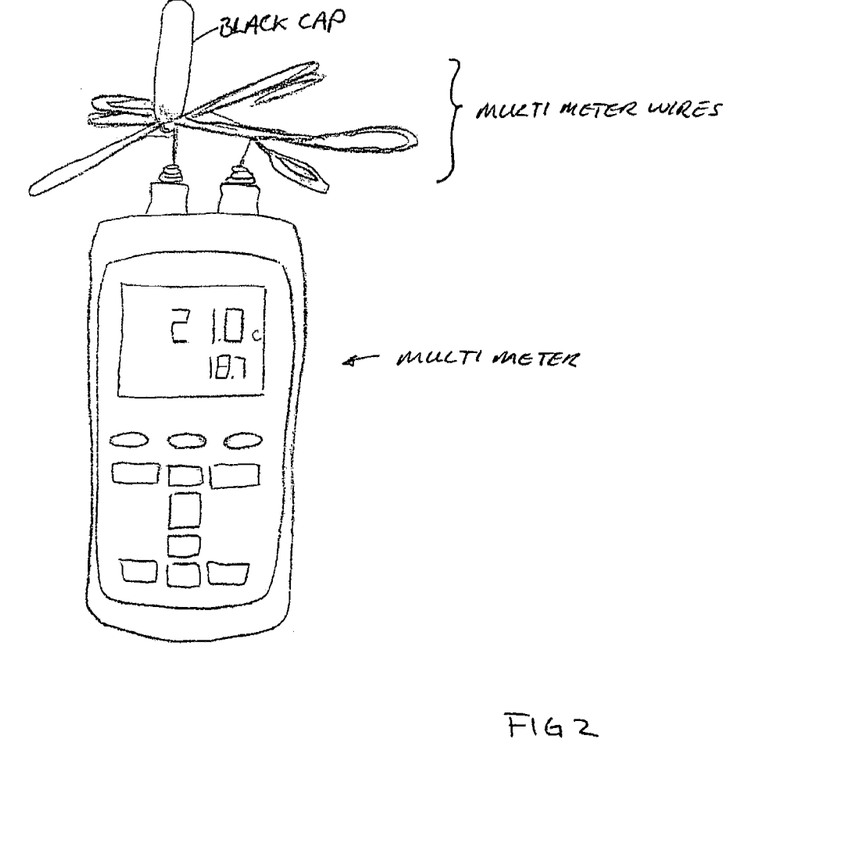
FIG. 2 is the multi-meter of FIG. 1 showing a raised temperature within a black cap black body cavity.

This has been experimentally confirmed, in a constant temperature room; with the wooden apparatus shown in figure one.

In FIG. 1 a wooden base supports a wooden vertical rod. A second wooden rod is placed horizontally on top of the vertical rod. The whole apparatus is painted black. The end of the horizontal rid is then painted white. A dual temperature digital thermometer attached to the apparatus at the two opposite ends of the horizontal rod show that the white end is consistently hotter.

Radiation emitted from a first surface, with an area "A1", that reaches any second surface, with an area "$A_2$", of a two surface enclosure, is equal to the radiation emitted from the second surface that reaches the first surface. In mathematical form, this becomes, $$F_{1\text{-}2} A_1 = F_{2\text{-}1} A_2$$

If the shape of the first surface is either flat or convex, then the shape factor $F_{1\text{-}2} = 1$. In this situation the shape factor $F_{2\text{-}1}$ yields, $$F_{2\text{-}1} = A_1/A_2$$

Consider a blackbody cavity and the opening to the cavity as a two surface enclosure where the opening to the cavity is the first surface and the cavity is the second surface. The magnitude of the radiation emitted from the first surface is equal to, $$e_1 A_1 sT^4$$

The portion of this radiation that is absorbed by the cavity, that is the second surface, is then, $$e_2 e_1 A_1 sT^4$$

The portion of the radiation that is reflected from the second surface is then, $$(1-e_2) e_1 A_1 sT^4$$

Of this reflected radiation, the portion that reaches the opening, that is the first surface, using the shape factor $F_{2\text{-}1}$ is then, $$(A_1/A_2)(1-e_2) e_1 A_1 sT^4$$

The portion of the reflected radiation that re-contacts the second surface is, $$(1-A_1/A_2)(1-e_2) e_1 A_1 sT^4$$

The radiation that is reflected from the second surface and is reflected from the first surface is, $$(1-e_1)(1-e_2)(A_1/A_2)e_1 A_1 sT^4$$

Each time the radiation is reflected, a portion of the initially radiated power is lost. Adding the infinite sum of all the reflections will yield the total power radiated from the first surface to the second surface. The sum of the infinite geometric series of reflections is as follows.

$$P_{12} = e_1 A_1 sT_1^4 \cdot \frac{1}{1-[(1-A_1/A_2)(1-e_2)+(1-e_1)(1-e_2)(A_1/A_2)]}$$

Solving this equation, and dividing by $A_1$ yields.

$$f_{12} = \frac{e_2 sT_1^4}{e_1 \frac{A_1}{A_2} + e_2 - e_1 e_2 \frac{A_1}{A_2}}$$

$F_{2-1}$ can be found in a similar manner. $F_{2-1}$ is equal to, $$f_{21} = \frac{e_1 sT_2^4}{e_1 \frac{A_1}{A_2} + e_2 - e_1 e_2 \frac{A_1}{A_2}}$$

The Zeroth law states that any object in thermal equilibrium, must emit the same amount of radiation as it receives, or else it would heat up or cool down. To fulfill the Zeroth law, the radiation that the cavity receives from the environment, must be equal to the cavity radiation to the environment. In mathematical terms, this is equal to the following.

$$\frac{e_2 sT_1^4}{e_1 \frac{A_1}{A_2} + e_2 - e_1 e_2 \frac{A_1}{A_2}} = \frac{e_1 sT_2^4}{e_1 \frac{A_1}{A_2} + e_2 - e_1 e_2 \frac{A_1}{A_2}}$$

Simplifying the equation yields the following.

$$T_2^4 e_1 = T_1^4 e_2$$

Solving for $T_2$ yields.

$$T_2 = T_1 \cdot (e_2/e_1)^{1/4}$$

With an infinite number of reflections of the radiation inside the cavity, the cavity emissivity approaches 1. Therefore $T_2$ becomes.

$$T_2 = T_1 \cdot (1/e_1)^{1/4}$$

Let $$\psi = (1/\epsilon_1)^{1/4}$$

$T_2$ then becomes $$T_2 = T_1 \psi$$

More importantly $$T_2 \neq T_1$$

This blackbody effect can, and has, been confirmed by covering one of the two probes of a dual temperature digital thermometer with a black plastic pen lid. The covered probe will be hotter than the uncovered probe.

Seebeck Effect

A voltage can be produced in a loop consisting of two dissimilar metal wires when the two junctions are maintained at different temperatures. This voltage may be increased by connecting many junctions together in series. This is called a thermopile. Each combination of metals, or alloys, will produce a specific voltage for a specific temperature difference. There are a few well characterized combinations, such as a "K" type.

Power

The current produced by a thermocouple is related to the resistance in the wires, as stated by Ohm's law.

$$V = IR$$

Given a thermo voltage produced, the required resistance can be calculated for a specific power value as follows.

$$P = V^2/R$$

When designing a thermopile, the resistance of the wires may be predicted. The resistance of the wire is calculated as follows.

$$R = LP/A$$

The resistance "R" is related with the length of the wire "L", the cross sectional area "A", and the constant of the material P.

SUMMARY OF THE INVENTION

The inside of a blackbody cavity, at thermal equilibrium, can be shown to be hotter than the outside of the same cavity. A thermopile, utilizing the Seebeck effect, can be placed into the blackbody cavity, where the hot junctions are inside the cavity, and the cold junctions are outside the cavity. This thermopile produces a voltage.

In summary, the electrical generator according to one aspect of the present invention may be characterized as including:

(a) a source of only ambient heat, that is, a source of heat which is only harvested from ambient surroundings and not the result of the use of a fuel to provide the heat, and, (b) a thermopile having at least one hot end and at least one cold end.

The hot end is mounted in proximity to, for example encased or shrouded in, the source of ambient heat. The cold end is mounted so as to not be in contact with the source of ambient heat, to thereby maintain a temperature differential between the hot and cold ends. Again, the source of only ambient heat is a heat source which exists without directly applied heating using a fuel, so that the thermopile harvests the heat from the source as it exists ambiently in the ambient environment adjacent the hot end of the thermopile.

Advantageously the cold end is adapted for cooling in the ambient environment adjacent the cold end.

In two embodiments, not intended to be limiting, the source of ambient heat is chosen from the group including: a black body cavity, a geothermal well.

The thermopile may include an array of elongate Seebeck-effect loop members, that is, dissimilar metal loops in the genre described above which result in the Seebeck effect when having different temperatures at their opposite ends, electrically coupled, for example in series, to one another so as to dispose the hot end of each of the members encased or shrouded (collectively herein referred to as encased) within the black body cavity.

The members may be thermocouple wires and the array may include a bundle of the thermocouple wires. The members may also be, without intending to be limiting, imprinted, such as for example by a silk-screening process or the like, onto a non-electrically conductive substrate. The substrate may be pliable that is flexible, and may be formed into a cylinder so as to be easily encased within a cylindrical black body cavity.

Thus the black body cavity may be an elongate hollow black body housing and the thermopile may be a substantially parallel array of elongate Seebeck-effect loop members having their cold ends disposed and encased within the housing, and having their hot ends extending outwardly of the housing.

The present invention may also be characterized in a further aspect as providing a method for generating electricity, wherein the steps of the method mirror the components of the apparatus in that the method includes providing the components and putting them to use, vis:

a) providing a source of only ambient heat,
b) providing a thermopile having at least one hot end and at least one cold end,
c) mounting said at least one hot end in proximity to the source of only ambient heat, so that said at least one cold end is not in proximity to the source of only ambient heat, to thereby maintain a temperature differential between said at least one hot and cold ends, wherein the source of only ambient heat is chosen to be a heat source which exists without directly applied heating using a fuel, and
d) harvesting by the thermopile of heat from the source as it exists ambiently in the ambient environment adjacent said at least one hot end of the thermopile.

BRIEF DESCRIPTION OF THE DRAWINGS

In the drawings wherein like reference numerals denote corresponding parts in each view.

DETAILED DESCRIPTION OF EMBODIMENTS OF THE INVENTION

Figure 3:
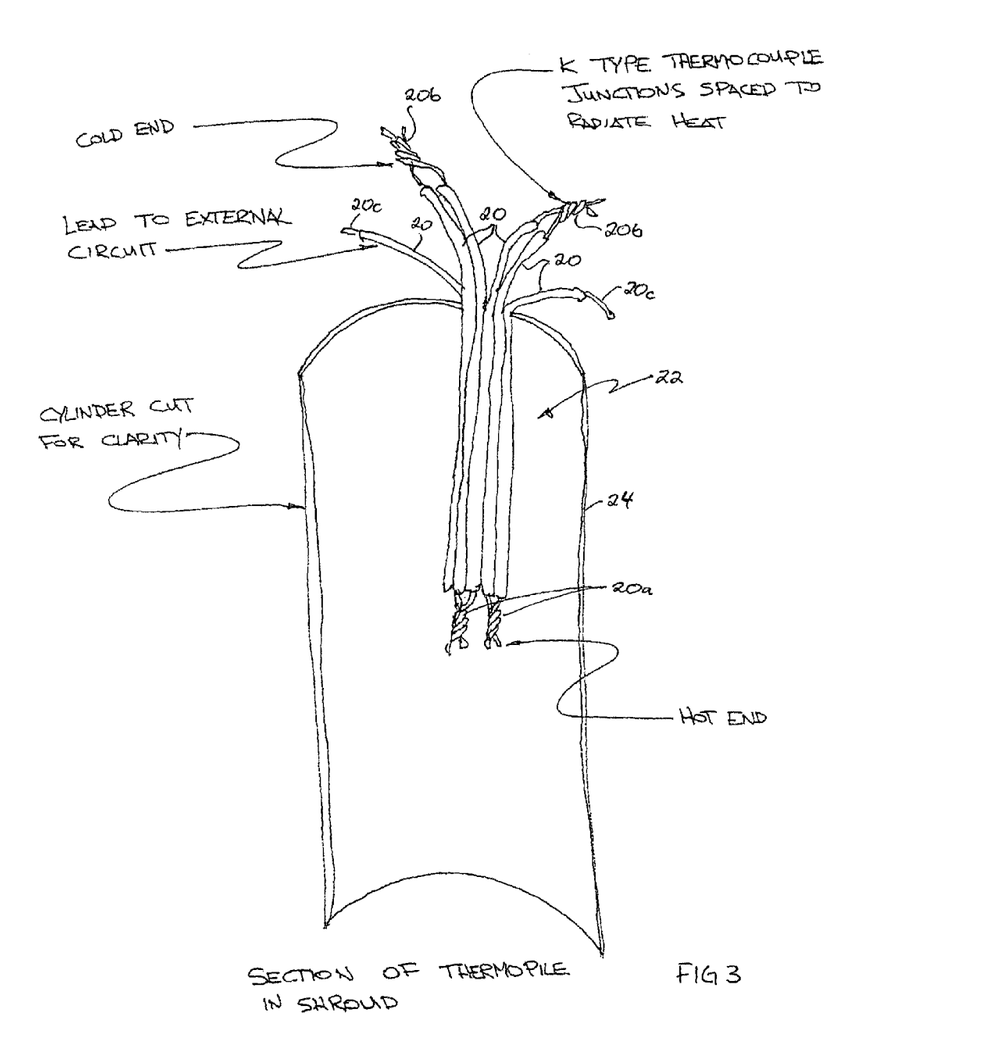
FIG. 3 is, in partially cutaway perspective view, a thermopile of thermocouple wires connected in series, bundled, and suspended partially within a hollow cylindrical black body cavity, shown sectioned in half.

FIG. 3 shows a bundle of "K" type thermocouple wires 20 joined together in series to form a thermopile 22. Thermopile 22 is suspended approximately half way down into a black cardboard tube 24. The black tube 24 (shown sectioned along its length but understood to be a cylindrical tube) provides a blackbody cavity and thus holds the lower ends 20*a* of the wires 20 in thermopile 22 at a higher temperature than the upper or free end of the wires thermopile 22. A measurable voltage was generated as indicated by a digital multimeter (not shown) connected to the leads 20*c* to the external circuit. Thermocouple wires 20 are one form of what are referred to herein as Seebeck-effect loop members.

The free ends 20*b* of wires 20 are spread out to enable heat to be radiated away.

The thermopile 22 thus generates a voltage from infrared radiation. This is useful because a voltage may now be generated in the dark, whereas photovoltaic cells require visible light.

As described above, the Seebeck effect in a thermopile produces a voltage. Thus where a thermopile 22 is partially encased within a black body cavity such as for example a tube like that of tube 24, so that the hot junctions of the thermopile (ends 20*a* in FIG. 3) are within the black body cavity and the cold junctions (ends 20*b* in FIG. 3) are outside the cavity, a measurable voltage is generated which can be measured across external leads 20*c*.

Figure 4:
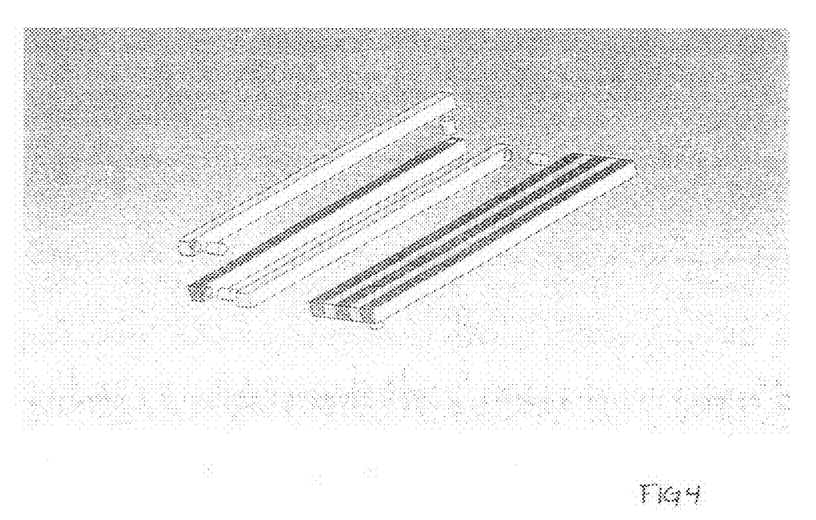
FIG. 4 is, in perspective partially exploded view, a further embodiment of a thermopile.

It is understood that it is intended to be within the scope of the present invention that black body cavities and thermopiles of many different designs may be employed in a system according to the present invention. The bundle of thermocouple wires forming a thermopile in the embodiment of FIG. 3 is but one example which is not intended to be limiting. A further example, again which is not intended to be limiting, is the following embodiment of FIG. 4-6, wherein, in order to produce larger currents and higher powers, the thermocouple wires have large cross sectional areas. As seen in FIG. 4, the thermopile wires may be rods 26. A stack of such rods, electrically connected in series at their ends, forms a thermopile. The rods may be circular in cross section for example, or may be non-circular such as seen in FIG. 4 where they are square in cross-section.

The following is an example of a thermopile utilizing square rods:

The thermopile is constructed out of square cross-section long metal rods. The rods are powder coated with an electrically insulating coating. The thermopile junctions at the ends of the rods are electrically connected together by known means, for example using metal dowel pins placed in holes drilled through the electrically insulating powder coating, as shown in the interlocking rod assembly of FIG. 4.

Figure 7:
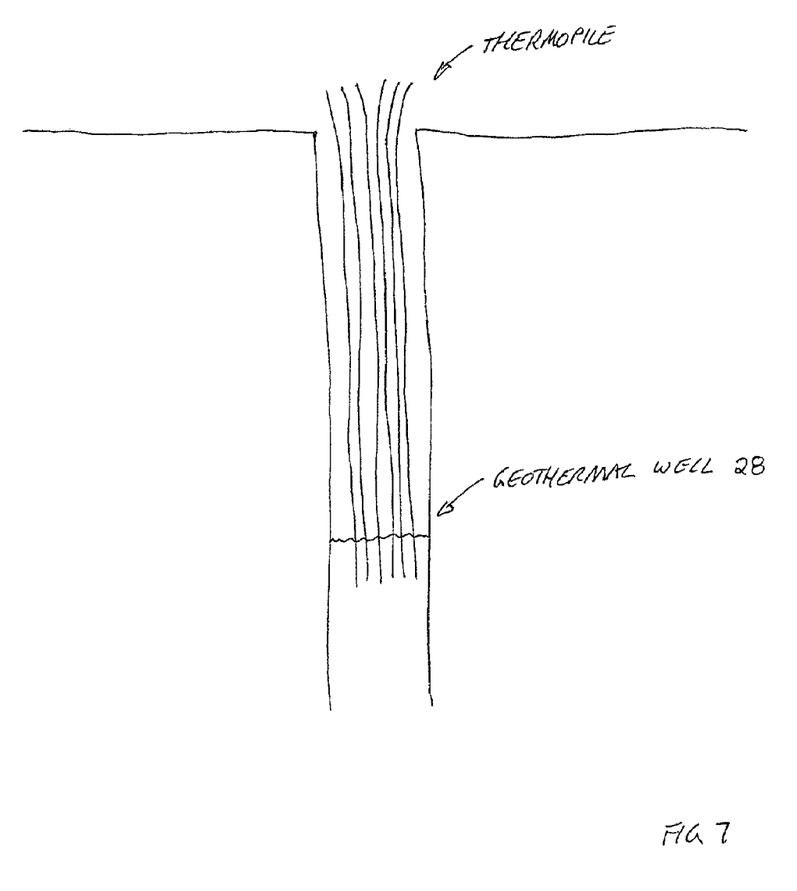
FIG. 7 is a diagrammatic view of a thermopile partially encased in a geothermal well.

The thermopile may be encased in a sheath for ease of handling. Because the thermopile may be very heavy if large enough the sheath may include a means for a crane to pickup the entire thermopile, sheath assembly. The thermopile may be lowered into a blackbody cavity, or other source of ambient heat such as the geothermal heat well 28 diagrammatically illustrated by way of example in FIG. 7, or an ambiently heated fluid. Other forms of thermopile may also be so heated.

Figure 5:
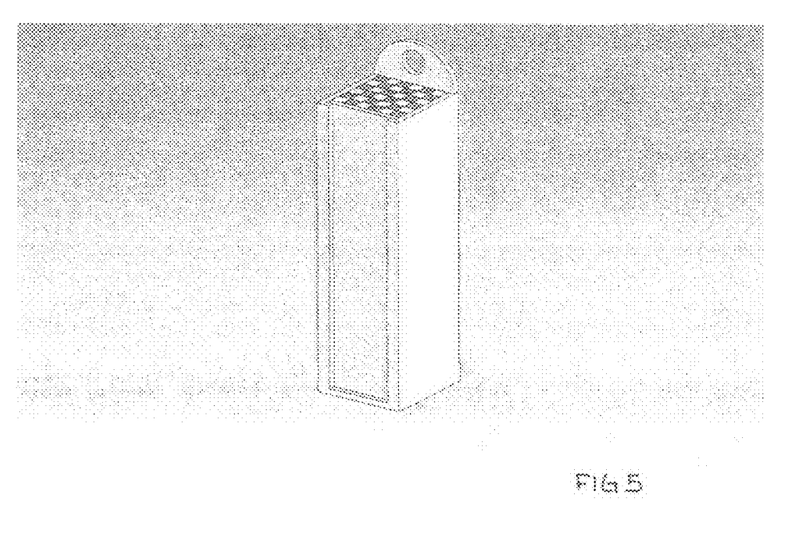
FIG. 5, is in perspective view, the assembled thermopile of FIG. 4 mounted within a sleeve.
Figure 6:
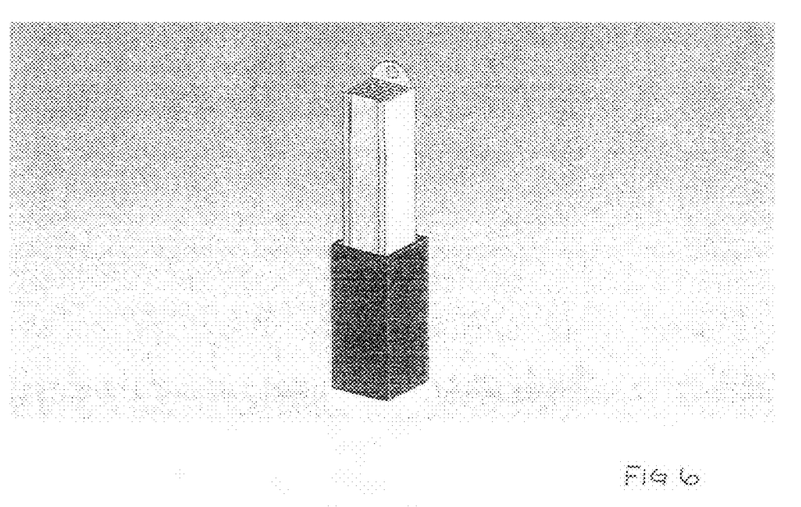
FIG. 6 is, in perspective view, the thermopile and sleeve of FIG. 5, partially cutaway encased within a black body cavity.

FIG. 5 shows the thermopile sheath assembly placed into a blackbody cavity so as to partially encase the thermopile in the black body cavity, to thereby heat the encased portion of the thermopile and produce a voltage.

Figure 8:
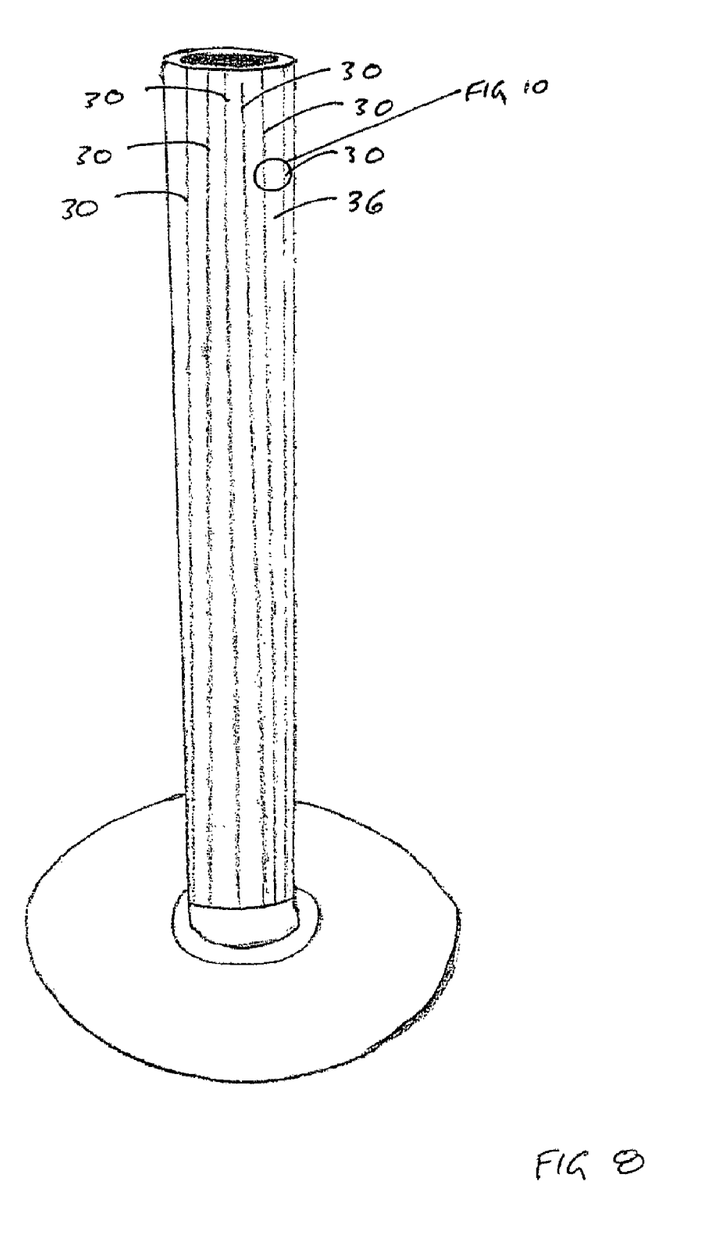
FIG. 8 is, in perspective view a further embodiment of a thermopile according to the present invention.
Figure 9:
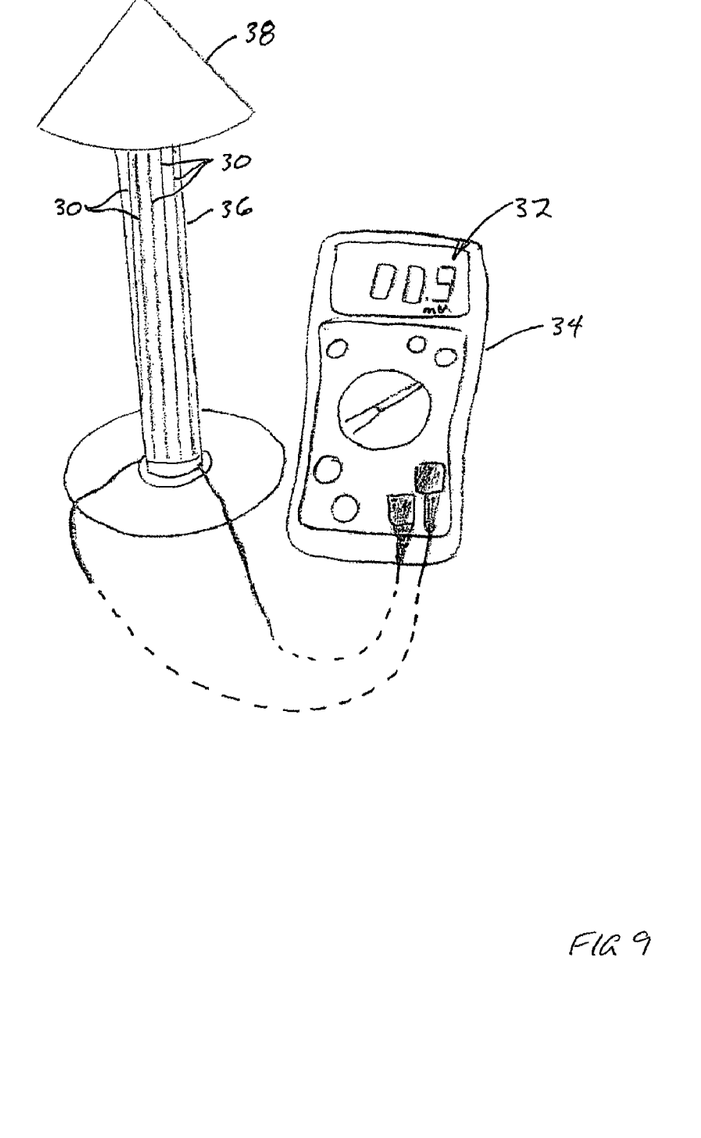
FIG. 9 is the thermopile of FIG. 8 with its upper end encased in a conical black body cavity, and showing a digital multi-meter electrically connected to the serially-connected Seebeck effect loop members formed as an array of vertical radially spaced apart bars radially spaced apart, and imprinted on, a cylindrical substrate.

In the embodiment of FIGS. 8 and 9, the Seebeck effect loop members forming the thermopile are, instead of thermocouple wires 20, imprinted conductive loops 30 of dissimilar metals. Loops 30 are arranged so that if the opposite ends of the loops are maintained collectively as cold ends and opposite hot ends, then a measurable voltage (indicated as 0.9 millivolts at 32 on multimeter 34) is produced according to the Seebeck effect discussed above. Loops 30 are imprinted on a substrate 36 which is electrically non-conductive. The substrate 36 may be flexible or pliable, and may for example be made of paper or fabric. The imprinting process may be akin to so-called silk-screening or may be other known methods of imprinting conductive material onto a non-conductive substrate. The substrate may, as shown, be formed as a cylinder for ease of encasement of the hot end of the thermopile within a source of ambient heat, for example within conical black body cavity shroud 38. Note that shroud 38 neither has to be snug on the hot end of the thermopile nor encase a large proportion of the length of the thermopile in order to generate a voltage.

Figure 10:
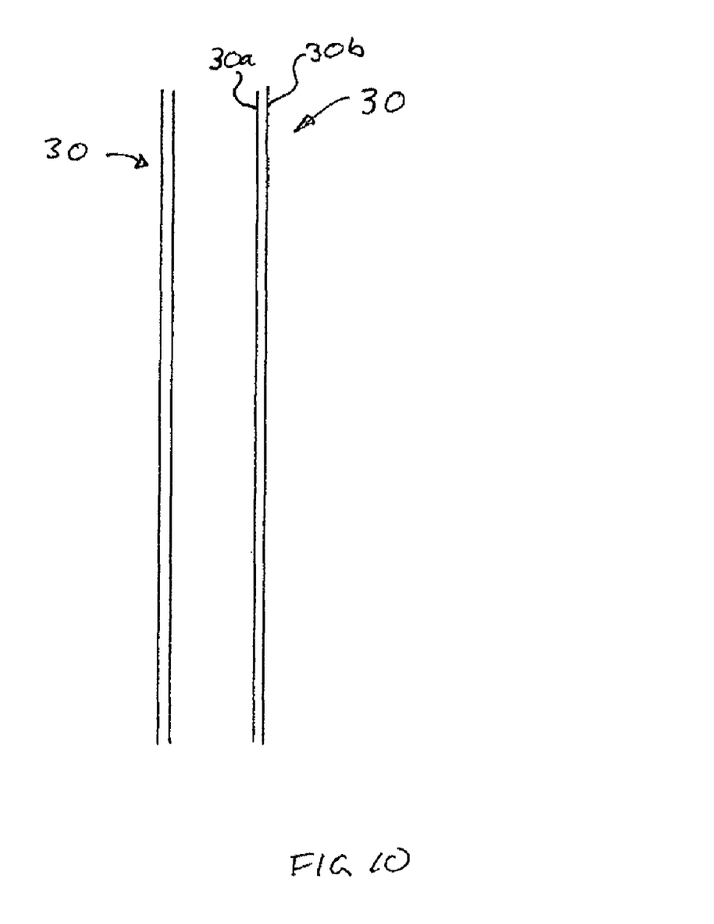
FIG. 10 is an enlarged view of a portion of FIG. 8 showing the parallel dissimilar metal ink lines formed each Seebeck-effect loop members in the array of loop members radially spaced around the substrate.

Seebeck-effect loops 30 may be formed, in each vertical loop 30, as a spaced-apart parallel pair of metallic lines of dissimilar metals. For example each pair of lines may include a silver metal ink line 30a parallel to and spaced from a nickel metal ink line 30b, in combination forming a Seebeck-effect loop. Each loop 30 is serially connected (not shown) to its adjacent loops 30, for example by a conductive path which "zig-zags" the electrical connections between the array of loops. The substrate 36 may be of various non-conductive materials, including for example paper, fabric, etcetera.

In a further alternative embodiment the source of ambient heat may be replaced by a low entropy heat engine.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. An electrical generator comprising: a source of only ambient heat, a thermopile having at least one hot end and at least one cold end, said at least one hot end mounted in proximity to said source of only ambient heat, said at least one cold end mounted so as to not be in contact with said source of only ambient heat, to thereby maintain a temperature differential between said at least on hot and cold ends, wherein said source of only ambient heat is a heat source which exists without directly applied heating using a fuel, so that said thermopile harvests said source as it exists ambiently in the ambient environment adjacent said at least one hot end of said thermopile; wherein said source of only ambient heat is chosen from the group comprising: a black body cavity, a geothermal well.

2. The generator of claim 1 wherein said at least one cold end is adapted for cooling in the ambient environment adjacent said at least one cold end.

3. The generator of claim 1 wherein said at least one hot end is encased in said source of only ambient heat.

4. The generator of claim 3 wherein said source of only ambient heat is a black body cavity.

5. The generator of claim 4 wherein said thermopile includes an array of elongate Seebeck-effect loop members, electrically coupled to one another so as to dispose said at least one hot end of each of said members encased within said black body cavity.

6. The generator of claim 5 wherein said members are electrically coupled by series to each other.

7. The generator of claim 6 wherein said members are thermocouple wires and said array includes a bundle of said thermocouple wires.

8. The generator of claim 7 wherein said at least one cold end is the cold end of each of said thermocouple wires, and wherein said at least one hot end is the hot end of each of said thermocouple wires.

9. The generator of claim 8 wherein said cold ends of said thermocouple wires are splayed from one another and extend outwardly from said black body cavity, so as to cool said cold ends in the ambient environment adjacent said cold ends.

10. The generator of claim 1 wherein said black body cavity is an elongate hollow black body housing and said thermopile is a substantially parallel array of elongate Seebeck-effect loop members having said at least one cold end disposed encased within said housing, and having said at least one hot end extending outwardly of said housing, wherein said members are electrically connected in series to one another.

11. The generator of claim 10 wherein said members are thermocouple wires.

12. The generator of claim 1 wherein said thermopile includes an array of See-beck-effect loop members imprinted onto a non-conductive substrate.

13. The generator of claim 12 wherein said substrate is a flexible sheet.

14. The generator of claim 12 wherein said substrate is formed as a cylinder.

15. The generator of claim 12 wherein said source of only ambient heat is a black body cavity.

16. A method for generating electricity comprising the steps of:
a) Providing a source of only ambient heat, wherein said source only ambient heat is chosen from the group comprising: a black body cavity, a geothermal well;
b) Providing a thermopile having at least one hot end and at least one cold end;
c) mounting said at least one hot end in proximity to said source of only ambient heat, so that said at least one cold end is not in proximity to said source of only ambient heat, to thereby maintain a temperature differential between said at least one hot and cold ends, wherein said source of only ambient heat is chosen to be a heat source which exists without directly applied heating using a fuel;
d) Harvesting by said thermopile of heat from said source as it exists ambiently in the ambient environment adjacent said at least one hot end of said thermopile.

17. The method of claim 16 further comprising adapting said at least one cold end for cooling in the ambient environment adjacent said at least one cold end.

18. The method of claim 16 further comprising encasing said at least one hot end in said source of only ambient heat.

19. The method of claim 18 wherein said source of only ambient heat is chosen to be a black body cavity.

20. The method of claim 19 further comprising providing said thermopile as an array of elongate Seebeck-effect loop members, and electrically coupling said members to one another in series and disposing said at least one hot end of each of said members so as to be encased within said black body cavity.

21. The method of claim 20 wherein said members are thermocouple wires and said array includes a bundle of said thermocouple wires.

22. The method of claim 21 further comprising splaying said cold ends of said thermocouple wires from one another and extending said cold ends outwardly from said black body cavity, so as to cool said cold ends in the ambient environment adjacent said cold ends.

23. The method of claim 16 further comprising providing said black body cavity as an elongate hollow black body housing and said thermopile as a substantially parallel array of elongate Seebeck-effect loop members, and disposing said at-least one cold end so as to be encased within said housing, and extending said at least one hot end extending outwardly of said housing, and electrically connecting said members in series to one another.

24. The generator of claim 23 wherein said members are thermocouple wires.

25. The method of claim 16 wherein said thermopile includes an array of Seebeck-effect loop members imprinted onto a non-conductive substrate.

26. The method of claim 25 wherein said substrate is a flexible sheet.

27. The method of claim 25 wherein said substrate is formed as a cylinder.

28. The method of claim 25 wherein said source of only ambient heat is a black body cavity.

* * * * *